United States Patent [19]
Lindley

[11] Patent Number: 5,675,178
[45] Date of Patent: Oct. 7, 1997

[54] NO-BOND INTEGRATED CIRCUIT INPUTS

[75] Inventor: David Robert Lindley, Starkville, Miss.

[73] Assignee: Cypress Semiconductor Corp., San Jose, Calif.

[21] Appl. No.: 561,948

[22] Filed: Nov. 22, 1995

[51] Int. Cl.⁶ .................................................. H07L 23/495
[52] U.S. Cl. ........................ 257/666; 257/773; 257/784; 257/786; 257/379
[58] Field of Search ................................ 257/666, 773, 257/784, 786, 379, 665

[56] References Cited

U.S. PATENT DOCUMENTS 5,229,846  7/1993  Kozuka ..................................... 257/666
5,264,727  11/1993  Kudou et al. ........................... 257/666
5,289,040  2/1994  Rogers ..................................... 257/666
5,455,460  10/1995  Hongo et al. ........................... 257/666

*Primary Examiner*—Tom Thomas
*Assistant Examiner*—David B. Hardy
*Attorney, Agent, or Firm*—Bliss McGlynn, P.C.

[57] ABSTRACT

A method and means for use when doing multiple products on an IC die and it becomes necessary to no-bond a control or address input thus requiring the connection of this IC input to a voltage of the proper polarity. In such a situation, an unused input pad is selectively bonded to a supply leadframe finger and connected to suitable logic to pull the unconnected IC input to the proper voltage. An embodiment whereby problems with noisy input voltages can be readily overcome is also described.

15 Claims, 2 Drawing Sheets

NO-BOND INTEGRATED CIRCUIT INPUTS

FIELD OF THE INVENTION

The present invention relates to integrated circuits and more particularly to a method and means for selectively connecting a no-bond integrated circuit input to a supply rail of proper polarity.

BACKGROUND OF THE INVENTION

A bond pad on an integrated circuit (IC) die may or may not have a bond wire connecting it to either an input leadframe finger or a supply voltage (VSS or VCC) leadframe finger. In general, for the IC to operate properly its circuitry must be connected to a voltage of the proper polarity using the bond pad-to-leadframe finger bond wire connection. For example, some ICs have an output-enable input bond pad that functions to turn on the IC outputs when a supply voltage of a specific polarity is applied, e.g., VSS, so that this pad must be connected to an input leadframe finger that has an appropriate polarity voltage applied to it for the outputs to work. If this connection is not made or the incorrect polarity voltage is applied, i.e., VCC, the IC outputs will not turn on. Similarly, some types of ICs, e.g., SRAMs, PROMs, ROMs, etc., have address bond pads that are used in selecting specific portions of the circuitry to be operated on. The size or density of the product is determined by the number of address bond pads used, i.e., the larger the number of address bond pads, the larger the size. Again, if the proper voltages are not applied to the address bond pads, incorrect portions of the circuitry will be operated on.

When doing multiple products on a single die, e.g., making a 4k×8 SRAM with output enable and a 4k×8 SRAM without output enable, or making a 4k×8 SRAM from an 8k×8 SRAM, it is sometimes necessary to no-bond the control and/or address bond pads. It then becomes necessary to connect these no-bonded integrated circuit (IC) inputs to a voltage of the proper polarity. This may be accomplished, for instance, by bonding the unused IC input to an adjacent supply or an adjacent IC input of proper polarity, or by wiring a leaker device to the unused IC input.

Conventional approaches to the needed connection are to permanently attach a leaker device to the IC input to be no-bonded or to bond the IC input to a power supply leadframe finger. However, permanently attaching a leaker device to the IC input can increase the input leakage current beyond that allowed in the circuit specification. Also, depending on the strength of the leakers and the number in the circuit, the leakage current may cause the circuit to violate the standby current specifications. Further, bonding the IC input to a power supply leadframe finger might be unacceptable if there are no power supply leadframe fingers available or the leadframe supply is of a different type than that of the internal circuits, i.e., noise on an external VSS might cause circuits on an internal VSS to glitch. Consequently, while the foregoing suggested techniques may be satisfactory in some applications, they are problematical when the circuit designer is faced with such constraints as:

1. a leaker device cannot be connected to the IC input to tie it either high or low because of input specifications;

2. there is no input leadframe finger of the proper polarity available to which the unconnected IC input can be bonded;

3. there is no power supply leadframe finger of the proper polarity available to which the unconnected IC input can be bonded; and/or, 4. the internal circuitry is to be isolated from a supply bond pad.

It is therefore desirable in the art to achieve a simple solution to the problem of a no-bond of a control or address IC input.

It is accordingly an object of the present invention to provide a method and means for achieving an improved technique for dealing with no-bonds of IC inputs in integrated circuits.

It is another object of the invention to provide an improved method and means using an unused input pin and additional logic to pull an unbonded IC input to a known state and eliminate the input leakage current problem.

It is also an object of the invention to provide a method and means that enables "smaller" SRAM parts to be produced from "larger" die without any additional fabrication costs and obviates the need for new metal masks in packaging parts of an SRAM die.

It is a further object of the invention to provide a method and means that overcomes problems with noisy input voltages.

SUMMARY OF THE INVENTION

The present invention involves a method and means for use when doing multiple products on an IC die and it becomes necessary to no-bond a control or address (IC) input thus requiring the connection of this IC input to a voltage of the proper polarity. In accordance with the invention, instead of permanently wiring a leaker device to such an IC input, which would run the risk of violating the device's input specification, an unused or no-connect (NC) input pad is selectively bonded to a supply voltage leadframe finger, which NC input pad is coupled to a common connection to the drain of a leaker transistor and the base or gate of a strong transistor. The IC input pad is coupled to the drain of the strong transistor, so that it will be pulled to a voltage of the opposite polarity from the supply voltage of the leadframe finger. Alternative circuit arrangements are described for VSS and VCC leadframe finger inputs and for isolating an input from a noisy voltage source.

BRIEF DESCRIPTION OF THE DRAWINGS

The present invention will be described in more detail below with reference to the accompanying drawings in which.

DETAILED DESCRIPTION OF THE PREFERRED EMBODIMENTS

The present invention is directed to a method and means for use when doing multiple products on an IC die and it becomes necessary to no-bond a control or address (IC)

input, and embodies selectively connecting the no-bond IC input to a supply rail of proper polarity by coupling an unused input pin and additional logic to a supply voltage of proper polarity to pull the unbonded IC input to the desired state. The features of the invention will be understood from a consideration of the following descriptions of exemplary alternative embodiments.

Figure 1:
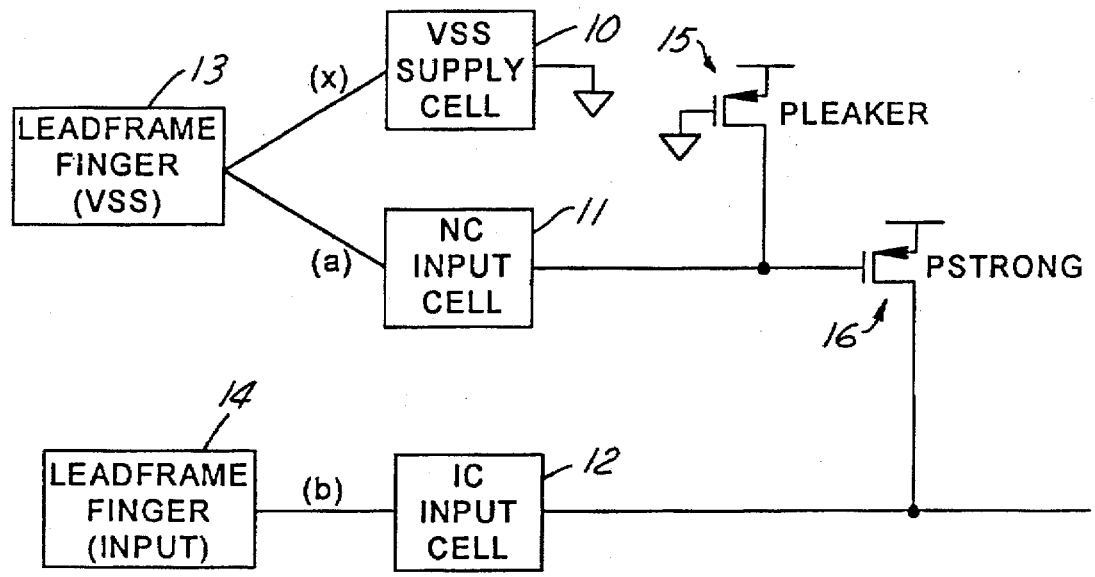
FIG. 1 is a schematic diagram illustrating a VSS connected no-bond circuit arrangement in accordance with the invention showing the alternative bond wire connections for bonded and no-bonded IC inputs.

FIG. 1 illustrates a circuit in accordance with the invention for pulling an unconnected input to VCC using an unused input bonded to VSS. More particularly, a VSS supply cell 10, a no-connected (NC) input cell 11, and an IC input cell or pad 12 are shown in combination with a VSS supply leadframe finger 13 and an input leadframe finger 14. There is a direct permanent connection (x) between VSS supply cell 10 and the VSS leadframe finger 13. The NC input cell 11 is coupled to the drain of a pleaker transistor 15 and the gate of a pstrong transistor 16, while the IC input 12 is coupled to the drain of pstrong 16. The pleaker transistor 15 and pstrong transistors, 15 and 16, have their sources coupled to the other voltage of opposite polarity, VCC. Bond wire (a) is shown connecting VSS leadframe finger 13 and NC input pad 11, and bond wire (b) is shown connecting the input leadframe finger 14 to IC input pad 12, for purposes of explanation. In the configuration shown, when the IC input pad 12 is to be bonded, bond wire (b) between the input leadframe finger 14 and IC input pad 12 is used and bond wire (a) between VSS leadframe finger 13 and NC input cell 11 is not used, cell 11 being normally a no-connect (NC). This allows the NC input to be pulled high via the weak pleaker 15, turning off pstrong 16, so that there is negligible input DC current resulting from the no-bond option. If, however, the IC input pad 12 is to be no-bonded, in accordance with the invention, bond wire (a) is used and bond wire (b) is not. Thus, the NC input cell 11 is connected or bonded to the VSS leadframe finger 13 over-riding the weak pleaker 15 and turning on pstrong 16 to pull the unused (unbonded) IC input high, i.e., to VCC.

Figure 2:
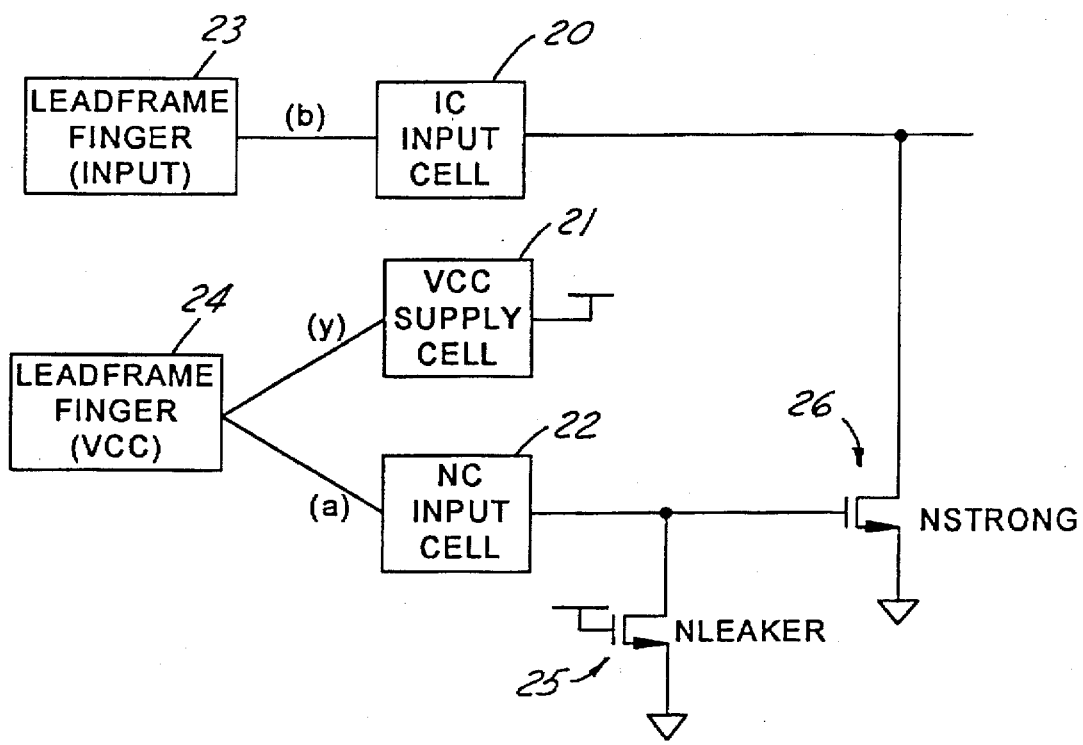
FIG. 2 is a schematic diagram illustrating a VCC connected no-bond circuit arrangement in accordance with the invention showing the alternative bond wire connections for bonded and no-bonded IC inputs.

FIG. 2 shows a circuit used to pull an unconnected input to VSS using an unused input bonded to VCC. In this instance, an IC input cell 20, a VCC supply cell 21, and a no-connected (NC) input cell 22, are shown in combination with an input leadframe finger 23 and a VCC leadframe finger 24. There is a direct permanent connection (y) between VCC supply pad 21 and the VCC leadframe finger 24. The NC input cell 22 is coupled to the drain of nleaker transistor 25 and the gate of nstrong transistor 26, while the IC input 20 is coupled to the drain of nstrong 26. The sources of these transistors are coupled to VSS. Bond wire (a) is shown connecting the VCC leadframe finger 24 and NC input pad 22, and bond wire (b) is shown connecting the input leadframe finger 23 to IC input pad 20, again, for purposes of explanation. In the configuration shown, when the IC input is to be bonded, bond wire (a) between the VCC leadframe finger 24 and NC input cell 22 is not Used, and bond wire (b) between the input leadframe finger 23 and IC input pad 20 is used. This allows the NC input to be pulled low via the weak nleaker 25, turning off nstrong 26, so that there is negligible input DC current resulting from the no-bond option. But, if the IC input is to be no-bonded, bond wire (a) is used and bond wire (b) is not. Thus, the NC input cell 22 is connected or bonded to the VCC leadframe finger 24 over-riding the weak nleaker 25 and turning on nstrong 26 to pull the unused (unbonded) IC input 20 low, i.e., to VSS.

Figure 3:
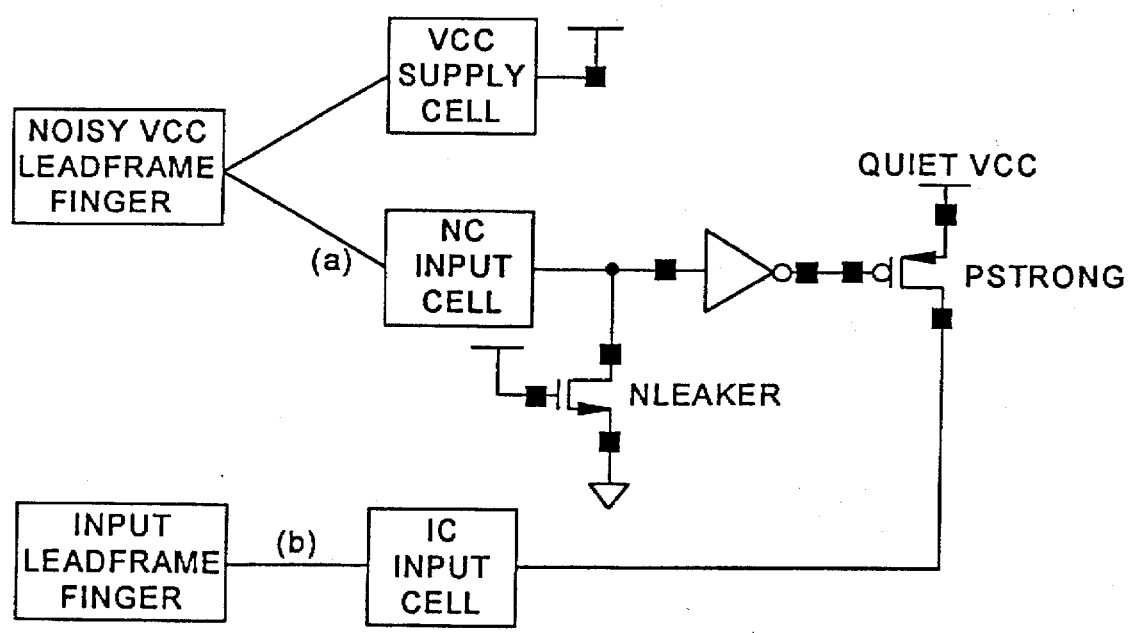
FIG. 3 is a schematic diagram illustrating a VCC connected no-bond circuit arrangement of the type as in FIG. 2, modified in accordance with the invention to embody alternative bond wire connections and logic for isolating an input from a noisy VCC leadframe finger.

A circuit for isolating an input from a noisy VCC leadframe finger is shown in FIG. 3. It will be seen that the circuit of FIG. 2, wherein NC input cell 22 is coupled to the drain of nleaker transistor 25 and the gate of nstrong transistor 26, and the IC input 20 is coupled to the drain of nstrong 26, has been modified to connect an inverter 38 to NC input cell 32 and the drain of nleaker transistor 35. The output of the inverter 38 is coupled to the base or gate of a pstrong transistor 36 and the IC input cell 30 is coupled to the drain of pstrong 36, the source of which is coupled to quiet VCC. There is a direct permanent connection (z) between VCC supply cell 31 and the noisy VCC leadframe finger 34. Bond wire (a) is shown connecting the noisy VCC leadframe finger 34 and NC input pad 32, and bond wire (b) is shown connecting the input leadframe finger 33 to IC input pad or cell 30, again, for purposes of explanation. In the configuration shown, when the IC input is to be bonded, bond wire (a) between the noisy VCC leadframe finger 34 and NC input cell 32 is not used, and bond wire (b) between the input leadframe finger 33 and IC input pad 30 is used. This connection causes the nleaker 35 to pull down the input of inverter 38, pulling the gate of pstrong 36 to VCC, and thereby turning off pstrong 36 and allowing the IC input (30) to operate normally. Now, if the IC input cell 30 is to be no-bonded, bond wire (a) is used and bond wire (b) is not. Accordingly, the nleaker 35 is over-ridden, which turns on pstrong 36, pulling the unused (unbonded) IC input 30 to quiet VCC. The problem of the noisy VCC leadframe finger input is thus overcome.

An alternative circuit arrangement can readily be implemented, in accordance with the foregoing approach, for pulling the IC input to quiet VSS when connected to a noisy VSS leadframe finger by using a pleaker, an inverter, and an nstrong transistor connected to quiet VSS.

It will therefore be seen that the illustrative embodiments set forth above provide a method and means for dealing with no-bond IC inputs in integrated circuits, which eliminates the input leakage current problem. The use of this method and means enables "smaller" SRAM parts to be produced from "larger" die without any additional fabrication costs, the need for new metal masks in packaging parts of an SRAM die being obviated. Problems with noisy input voltages can also be readily overcome.

While the present invention has been described in terms of specific embodiments and combinations, it will be appreciated that the invention is not limited to the particular examples presented herein, and that the scope of the protection is defined in the attached claims.

I claim:

1. In an integrated circuit having a supply pad, a no-connect (NC) input pad, and an integrated circuit (IC) input pad, in combination with IC logic and an input leadframe finger and a supply voltage leadframe finger, which is coupled to one of two supply voltages of opposite polarity and said supply pad, wherein said IC input pad is to be no-bonded, the connections comprising:

said NC input pad is coupled to a common connection to the drain of a leaker transistor and the gate of a strong transistor in said IC logic, said leaker and strong transistors having their sources coupled to the other of said two voltages of opposite polarity from the one supply voltage coupled to said supply voltage leadframe finger;

said IC input pad is coupled to the drain of said strong transistor; and bond wire means coupling said NC input pad to said supply voltage leadframe finger for pulling said IC input pad to the other of said two supply voltages from the one supply voltage coupled to said supply voltage leadframe finger.

2. A circuit as in claim 1 wherein said supply voltage leadframe finger is coupled to voltage VSS and said leaker transistor comprises a pleaker.

3. A circuit as in claim 1 wherein said supply voltage leadframe finger is coupled to voltage VCC and said leaker transistor comprises an nleaker.

4. A circuit as in claim 1 wherein said supply pad is coupled to the gate of said leaker transistor.

5. A circuit as in claim 1 wherein said leaker transistor and said strong transistor are of the same type.

6. A method for use when doing multiple products on an IC die where it is necessary to no-bond a control or address (IC) input, said die having a supply pad, a no-connect (NC) input pad, and an integrated circuit (IC) input pad, in combination with IC logic and an input leadframe finger and a supply voltage leadframe finger, which is coupled to one of two supply voltages of opposite polarity and said supply pad, comprising the steps of:

coupling said NC input pad to a common connection to the drain of a leaker transistor and the base of a strong transistor in said IC logic, said leaker and strong transistors having their sources coupled to the other of two supply voltages of opposite polarity;

coupling said IC input pad to the drain of said strong transistor; and coupling said NC input pad to said supply voltage leadframe finger to pull said IC input pad to the other of said two supply voltages from the one coupled to said supply voltage leadframe finger.

7. The method of claim 6 wherein said supply voltage leadframe finger is coupled to voltage VSS and said leaker transistor comprises a pleaker.

8. The method of claim 7 wherein said supply voltage leadframe finger is coupled to voltage VCC and said leaker transistor comprises an nleaker.

9. The method of claim 7 wherein said supply pad is coupled to the gate of said leaker transistor.

10. The method of claim 7 wherein said leaker transistor and said strong transistor are of the same type.

11. In an integrated circuit having a supply pad, a no-connect (NC) input pad, and an integrated circuit (IC) input pad, in combination with IC logic and an input leadframe finger and a supply voltage leadframe finger, which is coupled by a noisy supply voltage and said supply pad, the connections comprising:

said NC input pad is coupled to a common connection to the drain of a leaker transistor and the input of an inverter, the output of said inverter being coupled to the gate of a strong transistor, said leaker and strong transistors and said inverter being in said IC logic;

said IC input pad is coupled to the drain of said strong transistor, the source of said strong transistor being coupled to a quiet voltage of the same polarity as said noisy supply voltage; and bond wire means coupling said NC input pad to said noisy supply voltage leadframe finger for pulling said IC input pad to said quiet voltage.

12. A circuit as in claim 11 wherein said supply voltage leadframe finger is coupled to a noisy VCC voltage and said leaker transistor comprises an nleaker and said strong transistor comprises a pstrong.

13. A circuit as in claim 11 wherein said supply voltage leadframe finger is coupled to a noisy VSS voltage and said leaker transistor comprises a pleaker and said strong transistor comprises an nstrong.

14. A circuit as in claim 11 wherein said supply pad is coupled to the gate of said leaker transistor.

15. A circuit as in claim 11 wherein said leaker transistor and said strong transistor are of opposite types.

* * * * *